United States Patent [19]

Yamada

[11] Patent Number: 4,951,105
[45] Date of Patent: Aug. 21, 1990

[54] SOLID-STATE IMAGE PICKUP DEVICE

[75] Inventor: Tetsuo Yamada, Yokohama, Japan

[73] Assignee: Kabushiki Kaisha Toshiba, Kawasaki, Japan

[21] Appl. No.: 320,617

[22] Filed: Mar. 8, 1989

[30] Foreign Application Priority Data

Mar. 8, 1988 [JP] Japan .................................. 63-54494

[51] Int. Cl.$^5$ ........................ H01L 27/14; H01L 31/00
[52] U.S. Cl. ......................................... 357/30; 357/24
[58] Field of Search ............... 357/30 G, 30 I, 30 PF, 357/24 LR

*Primary Examiner*—Rolf Hille
*Assistant Examiner*—R. Ratliff
*Attorney, Agent, or Firm*—Foley & Lardner, Schwartz, Jeffery, Schwaab, Mack, Blumenthal & Evans

[57] ABSTRACT

A solid-state image pickup device, effectively preventing dark current, includes a photosensitive pixel section formed at the surface portion of a semiconductor layer of one conductivity type. Each pixel consists of an impurity layer of an opposite conductivity to generate signal carriers; an element isolation layer formed adjacent each photosensitive pixel to isolate the photosensitive pixels from each other; transfer electrodes for transferring the signal carriers; and a storage electrode formed at the upper portion of each photosensitive pixel and responsive to the application of a voltage to allow carriers of opposite polarity to that of the signal carriers, to be injected from the element isolation layer into the surface portion of each photosensitive pixel. The storage electrode has an opening at a portion corresponding to an optical path to which the light is incident.

4 Claims, 2 Drawing Sheets

SOLID-STATE IMAGE PICKUP DEVICE

BACKGROUND OF THE INVENTION

This invention relates to a solid-state image pickup device.

Solid-state image pickup devices take out signal carriers produced at the junction portion provided at every pixel on the semiconductor substrate surface to transfer them, and therefore provide a pictorial image signal.

In such solid-state image pickup devices, it is important in improving the picture quality, to effectively prevent dark currents by the signal carriers which are produced even if no light is incident thereto.

An approach is disclosed in Japanese Patent No. 1325458 by the assignee of this application, to form an inverting layer at the surface portion of the photosensitive pixel where the dark current is produced to the maximum degree, thereby permitting the dark current to be drastically reduced. For this purpose, a storage electrode is provided on the photosensitive pixel through an insulating film. A bias power source is connected to the storage electrode. When a negative voltage is applied to the storage electrode by the bias power source, an inversion layer is formed at the surface portion of the photosensitive pixel. Thus, the occurrence of the dark current is prevented.

Since it is required that incident light pass through the storage electrode to reach the photosensitive pixel, the storage electrode must be transparent. However, the electrode materials which can be formed most easily and stably at present are not necessarily transparent. For example, where a polycrystalline silicon electrode is used, light with a short wavelength (blue light) is remarkably absorbed, with the result that the so-called blue sensitivity is greatly reduced. For this reason, when an attempt is made to provide a color image pickup signal using a solid-state pickup device, the entire color balance must be adjusted by suppressing the medium- and long-wavelength sensitivities in harmony with the short wavelength sensitivity, resulting in the problem that the sensitivity of an apparatus using such a solid-state image pickup device is remarkably degraded.

SUMMARY OF THE INVENTION

An object of this invention is to provide a solid- state image pickup device which prevents the occurrence of dark current and which also has a high sensitivity.

In accordance with this invention, there is provided a solid-state image pickup device comprising a semiconductor layer of one conductivity type; a photosensitive pixel section formed at the surface portion of the semiconductor layer, the photosensitive pixel section being such that a plurality of impurity layers of the opposite conductivity type sensitive to light to generate signal carriers, are regularly arranged; an element isolation layer formed adjacent to each of the photosensitive pixels constituting the photosensitive pixel section to allow the photosensitive pixels to be isolated from each other; transfer means for transferring the signal carriers; a storage electrode formed at the upper portion of each of the photosensitive pixels and responsive to the application of a voltage to allow carriers having a polarity opposite that of the signal carriers, to be injected from the element isolation layer of the one conductivity type into the surface portion of each of the photosensitive pixels, thus reducing a dark current at the surface portion of each of the photosensitive pixels, wherein the storage electrode is provided with an opening at a portion corresponding to an optical path to which light is incident.

In this solid-state image pickup device, the storage electrode responds to the application of a voltage thereto to generate, from the element isolation layer, carriers having a polarity opposite to that of the signal carriers at the surface portion of the photosensitive pixel, to therefore suppress the occurrence of dark current. On the other hand, the photosensitive pixel receives light which has passed through the opening without being hindered by the storage electrode, to generate signal carriers.

Accordingly, this results in the possibility of sufficiently reducing the dark current and of improving the sensitivity. In addition, in the case where the portion of the photosensitive pixel corresponding to the opening has an impurity concentration lower than that of other portions of the photosensitive pixel, in the case where an impurity layer of the same conductivity type as the semiconductor layer of one conductivity type, is formed at the surface portion of the photosensitive pixel corresponding to the opening, or in the case where the surface portion of the photosensitive pixel is covered with an impurity layer of the same conductivity type as the semiconductor layer of one conductivity type, it is possible to sufficiently reduce the dark current even more, and to realize the complete transfer of signal carriers to eliminate after image.

DESCRIPTION OF THE PREFERRED EMBODIMENTS

Figure 1A:
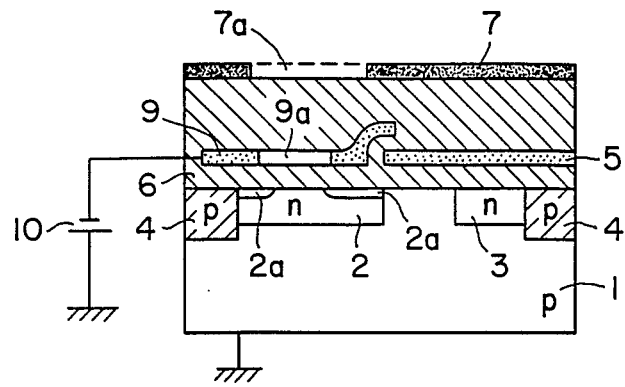
FIG. 1A is a cross sectional view showing the structure of a solid-state image pickup device according to a first embodiment of this invention.
Figure 1B:
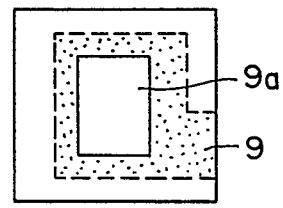
FIG. 1B is a plan view of the storage electrode of the solid-state image pickup device shown in FIG. 1.

The structure of a solid-state image pickup device according to a first embodiment of this invention will be described with reference to FIG. 1A which is the cross sectional view thereof, and FIG. 1B which is the plan view of the storage electrode 9.

The p-type semiconductor layer 1 includes a photosensitive pixel 2 comprising an n-type impurity layer and responsive to incident light to generate signal carriers, and which is formed at the surface portion thereof. The p-type semiconductor layer 1 and the photosensitive pixel 2 form or constitute a photosensitive element. A transfer section 3 comprised of an n-type impurity layer serves to receive and transfer signal carriers generated in the photosensitive pixel 2. A transfer electrode 5 is provided above the transfer section 3 through an insulating layer 6. This transfer electrode 5 serves to control the potential of the transfer section 3 to transfer signal carriers in the direction perpendicular to the plane of the paper. An element isolation layer 4 is comprised of a p-type impurity layer. This element isolation layer 4 serves to electrically isolate the photosensitive pixel 2 and the transfer section 3 from the environment thereof, so that signal carriers existing in the photosensitive pixel 2 and the transfer section 3 do not leak into the environment thereof. The storage electrode 9 is provided above the photosensitive pixel 2 through the insulating layer 6. This storage electrode 9 responds to the application of a negative voltage by the bias power source 10 to form an inversion layer 2a at the surface portion of the photosensitive pixel 2. The inversion layer 2a is placed in a condition where it is filled with positive holes delivered from the element isolation layer 4.

A light screening or shielding film 7 formed above the storage electrode 9 serves to allow light to be transmitted only through the light receiving window 7a to irradiate it to the photosensitive pixel 2.

The storage electrode 9 is provided with an opening 9a at a portion corresponding to an optical path for incident light. For this reason, no inversion layer 2a is formed at the surface portion corresponding to the opening 9a of the photosensitive pixel 2.

When a negative voltage is applied to the storage electrode 9 by the bias power source 10, an inversion layer 2a is formed at the peripheral portion of the surface of the photosensitive pixel 2. This inversion layer 2a is placed in the condition where it is filled with positive holes delivered from the element isolation layer 4 in the same manner as in the prior art. As described above, such an inversion layer 2a is not formed over the entire surface of the photosensitive pixel 2. However, it has been already empirically confirmed that the source of the dark current is partially distributed at the portion adjoining the element isolation layer 4 in the photosensitive layer 2. Accordingly, the inversion layer 2a which is not present over the entire surface of the photosensitive pixel 2, but is formed at the above-described junction portion, can sufficiently lessen the dark current. In connection with this the dark current when the inversion layer is formed over the entire surface of the photosensitive layer 2, is reduced to about one fifth (1/5) of that when no inversion layer is formed On the other hand, in the case where opening 9a is provided as in this embodiment so that an incident light can reach 60% of the entire surface of the photosensitive pixel 2 without being hindered by the storage electrode 9 to form inversion layer 2a by such a storage electrode 9, the dark current at that time is reduced to about one fourth (¼) of that when no inversion layer 2a is formed.

Figure 5:
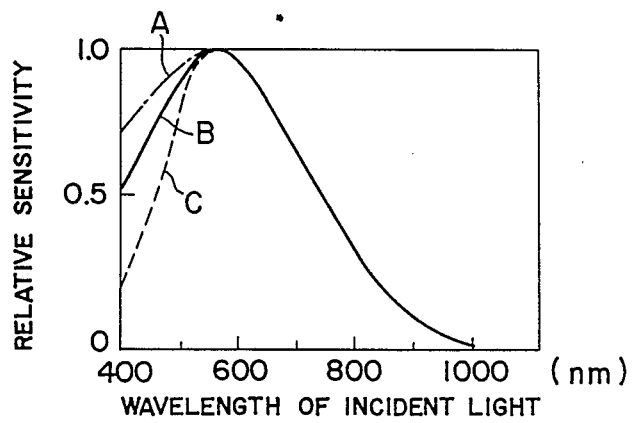
FIG. 5 is a characteristic curve showing the spectral sensitivity of the photosensitive element.

How the sensitivity of the solid-state image pickup device varies depending upon the wavelength of incident light, will be now described with reference to FIG. 5, wherein the single dotted lines A represent the spectral sensitivity when no storage electrode is provided, resulting in no inversion layer, wherein the solid line B represents the spectral sensitivity when storage electrode 9 of this embodiment is provided to form inversion layer 2a in the photosensitive pixel 2, and wherein the dotted lines C represent the spectral sensitivity when a conventional storage electrode having no opening is provided to form inversion layer in the photosensitive pixel. In the case of light having a long wavelength of more than 550 nm, there is no difference between the respective spectral sensitivities. Thus, it is seen that there is no influence due to the presence of the storage electrode. However, in the case of light having a long wavelength of less than 550 nm, the respective spectral sensitivities differ from each other. A comparison of the respective spectral sensitivities of light having a wavelength of 440 nm where the respective spectral sensitivities differ from the maximum degree is made as a ratio of these spectral sensitivities to those in the light of 550 nm. In the case where no storage electrode is provided (single dotted lines A), the spectral sensitivity in the 440 nm light becomes equal to 70% of that in the 550 nm light. In the case of this embodiment (solid line B), it becomes equal to 50% thereof. Furthermore, in the case of the prior art (dotted lines C), it becomes equal to 20% thereof. Accordingly, it is seen that the spectral sensitivity when opening 9a is provided in the storage electrode 9 as in this embodiment, is improved to such an extent that it is 2.5 times larger than that when no opening is provided as in the prior art.

On the other hand, when a comparison of the dark current is made, the dark current in the case of this embodiment is reduced to one fourth (¼) of that when no storage electrode is provided, whereas the dark current in the case of the prior art is reduced to one fifth (1/5) of that when no storage electrode is provided. Generally, the effective sensitivity of the solid-state image pickup device is determined by the S/N ratio on the basis of the ratio between the dark current component governing the noise component and the optical sensitivity. In the case of this embodiment, the dark current component is reduced to one fourth (¼) of that when no storage electrode is provided and the optical sensitivity with respect to the light of 400 nm is reduced to five sevenths (5/7) thereof. As a result, the S/N ratio is improved about three times. On the contrary, in the case of the prior art, the dark current component is reduced to one fifth of that when no storage electrode is provided and the optical sensitivity with respect to the light of 400 nm is reduced to two sevenths (2/7) thereof. As a result, the S/N ratio is improved about 1.4 times. Accordingly, the S/N ratio in the case of this embodiment is improved to such an extent that it is twice as large as that in the prior art.

Figure 2:
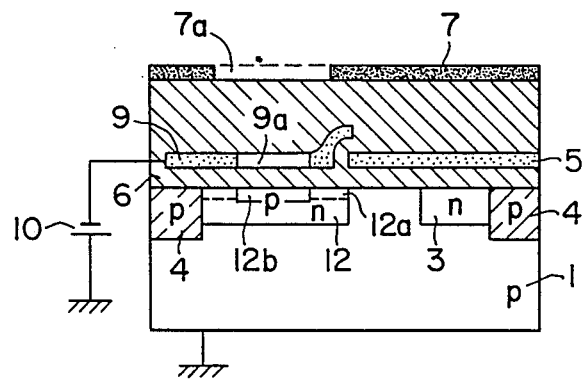
FIG. 2 is a cross sectional view showing the structure of a solid-state image pickup device according to a second embodiment of this invention.

The structure of a solid-state image pickup device according to a second embodiment of this invention will be described with reference to FIG. 2 which is the cross sectional view thereof. When compared with the first embodiment, this embodiment differs from the first embodiment in that a P-type impurity layer 12b is formed at the surface portion corresponding to the opening 9a in the photosensitive pixel 12. In accordance with this structure, the surface portion where the inversion layer 12a is not formed by the storage electrode 9 in the photosensitive pixel 12 is filled with positive holes by the P-type impurity layer 12b. Accordingly, the occurrence of dark current at this portion can be sufficiently suppressed. Thus, since the dark current component is reduced to about one fifth (1/5) of that when no storage electrode is provided, the S/N ratio is improved about 3.5 times. Furthermore, by suitably setting the impurity concentration or the impurity distribution of the impurity layer 12b, a complete transfer is realized so that no residual carrier is present at the portion corresponding to the opening 9a in transferring signal carriers from the photosensitive pixel 12 to the transfer section 3, therefore making it possible to eliminate the after image phenomenon resulting from imperfect transfer operation.

Figure 3:
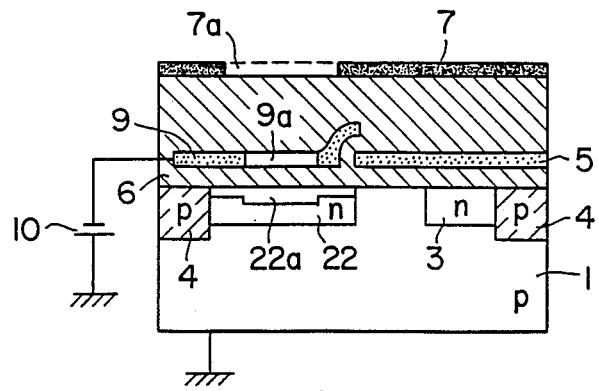
FIG. 3 is a cross sectional view showing the structure of a solid-state image pickup device according to a third embodiment of this invention.

The structure of a solid-state image pickup device according to a third embodiment of this invention will be described with reference to FIG. 3 which is the cross sectional view thereof. This embodiment differs from the first and second embodiments in that there is formed an impurity layer 22a such that the entire surface of the photosensitive pixel 22 is covered with a P-type layer, or an n-type layer having a concentration lower than that of portions except for the surface. This structure can reduce the absolute value of the voltage of the bias power source 10. Furthermore, by suitable setting of the impurity concentration or the impurity distribution of the impurity layer 22b in the same manner as in the second embodiment, complete transfer is realized to therefore make it possible to eliminate the after image phenomenon.

Figure 4:
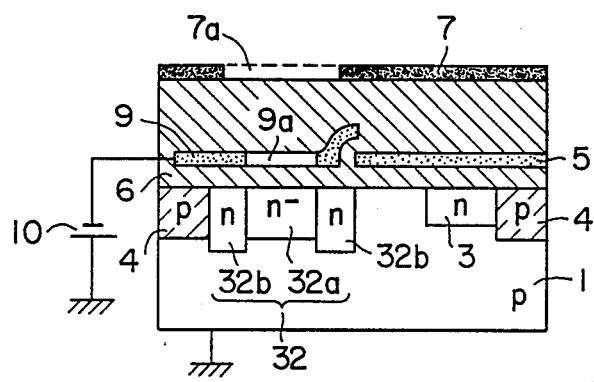
FIG. 4 is a cross sectional view showing the structure of a solid-state image pickup device according to a fourth embodiment of this invention.

The structure of a solid-state image pickup device according to a fourth embodiment of this invention will be described with reference to FIG. 4 which is the cross sectional view thereof. The photosensitive pixel 32 comprises n-type impurity layers 32a and 32b wherein the impurity layer 32a located at the position corresponding to the opening 9a, has an impurity concentration lower than that of the impurity layer 32b. Also, in the case of such a structure, by suitable setting of the impurity concentration or the impurity distribution of the impurity layer 32a, complete transfer is realized to therefore make it possible to eliminate the after image phenomenon.

It is to be noted that the structure of the solid-state image pickup device according to this invention is not limited to the embodiments shown in FIGS. 1A and 1B, 2, 3 and 4. For example, other materials except for the polycrystalline silicon may be used as the material for the storage electrode. In addition, even in the case where the conductivity type of the impurity and/or the signal carrier is inverted and the polarity of the bias power source is inverted in the above-described embodiments, advantages equivalent to those with these embodiments may be obtained.

What is claimed is:

1. A solid-state image pickup device comprising:
a semiconductor layer of one conductivity type;
a photosensitive pixel section having a plurality of photosensitive pixels formed at the surface portion of the semiconductor layer, said photosensitive pixel section being such that a plurality of impurity layers of an opposite conductivity type sensitive to light to generate signal carriers, are regularly arranged;
an element isolation layer formed adjacent to each of said photosensitive pixels constituting said photosensitive pixel section to allow said photosensitive pixels to be isolated from each other;
transfer means for transferring said signal carriers; and
a storage electrode formed above the upper portion of each of said photosensitive pixels and responsive to the application of a voltage to allow carriers having a polarity opposite that of said signal carriers, to be injected from said element isolation layer of said one conductivity type into the surface portion of each of said photosensitive pixels, thus reducing a dark current at said surface portion of each of said photosensitive pixels,
wherein said storage electrode is provided with an opening at a portion corresponding to an optical path to which light is incident.

2. A solid-state image pickup device as set forth in claim 1, wherein the portion of said photosensitive pixel corresponding to said opening, has an impurity concentration lower than that of other portions of said photosensitive pixel.

3. A solid-state image pickup device as set forth in claim 1, wherein an impurity layer of the same conductivity type as said semiconductor layer of said one conductivity type is formed at the surface portion of said photosensitive pixel corresponding to said opening.

4. A solid-state image pickup device as set forth in claim 1, wherein the surface portion of said photosensitive pixel is covered with an impurity layer of the same conductivity type as said semiconductor layer of said one conductivity type.

* * * * *